United States Patent
Ito (10) Patent No.: US 8,105,938 B2
(45) Date of Patent: Jan. 31, 2012

(54) SEMICONDUCTOR SUBSTRATE AND METHOD OF MANUFACTURING THE SAME

(75) Inventor: Hitoshi Ito, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 3 days.

(21) Appl. No.: 12/471,771

(22) Filed: May 26, 2009

(65) Prior Publication Data

US 2009/0294979 A1    Dec. 3, 2009

(30) Foreign Application Priority Data

May 28, 2008 (JP) ................ 2008-139155

(51) Int. Cl.
*H01L 21/4763* (2006.01)
*H01L 21/768* (2006.01)

(52) U.S. Cl. ............. 438/637; 438/622; 257/E21.577

(58) Field of Classification Search ............ 438/622, 438/637–640, 14–18
See application file for complete search history.

(56) References Cited

U.S. PATENT DOCUMENTS

| | | | | |
|---|---|---|---|---|
| 6,020,637 A | * | 2/2000 | Karnezos | 257/738 |
| 6,154,366 A | * | 11/2000 | Ma et al. | 361/704 |
| 7,001,782 B1 | * | 2/2006 | Diana et al. | 438/3 |
| 2007/0052086 A1 | * | 3/2007 | Oi et al. | 257/698 |
| 2008/0064127 A1 | * | 3/2008 | Yu et al. | 438/14 |
| 2009/0045519 A1 | * | 2/2009 | Kamikubo | 257/773 |

FOREIGN PATENT DOCUMENTS

JP    2000-059026    2/2000

* cited by examiner

*Primary Examiner* — Charles Garber
*Assistant Examiner* — Calvin Choi
(74) *Attorney, Agent, or Firm* — Drinker Biddle & Reath LLP (57) ABSTRACT

There is provided a method of manufacturing a semiconductor substrate. The method includes: (a) forming a wiring pattern on a substrate; (b) covering the wiring pattern with an insulating resin, thereby forming a first insulating layer; (c) forming a second insulating layer on the first insulating layer; (d) forming a plurality of grooves through the second insulating layer; (e) forming at least one via hole through the first and second insulating layers by irradiating at least one of the grooves with a laser beam; (f) forming a seed metal layer on an inner surface of the at least one via hole, inner surfaces of the grooves, and a surface of the second insulating layer; and (g) forming a plating layer in the at least one via hole and the grooves, by an electrolytic plating using the seed metal layer as a power feeding layer.

6 Claims, 6 Drawing Sheets

SEMICONDUCTOR SUBSTRATE AND METHOD OF MANUFACTURING THE SAME

This application claims priority from Japanese Patent Application No. 2008-139155, filed on May 28, 2008, the entire contents of which are hereby incorporated by reference.

BACKGROUND

1. Technical Field

The present disclosure relates to a method of manufacturing a semiconductor substrate and the semiconductor substrate.

2. Related Art

A higher integration density and a higher functionality are always required of a semiconductor substrate. In the related art, wirings are formed on the semiconductor substrate as finer patterns and the wirings are provided at a higher density. Thus, a higher integration density and a higher functionality of the semiconductor substrate can be achieved. For example, JP-A-2000-59026 discloses a semiconductor substrate in which wiring patterns are formed by forming a plurality of layers on the substrate, and then the wiring patterns are electrically connected to each other by filling a conductor in respective via holes formed through insulating layers.

FIGS. 4A to 6C show a related art manufacturing method of a semiconductor substrate. Firstly, a first wiring pattern 120 is formed on a core substrate 110 (FIG. 4A), and the first wiring pattern 120 is covered with an insulating layer 130 (FIG. 4B). Then, a via hole 160 is formed through the insulating layer 130 such that the first wiring pattern 120 is exposed, by a laser beam machining (FIG. 4C), and a plating seed layer 170 is formed on a surface of the insulating layer 130 and inner surfaces of the via holes 160 by a copper electroless plating (FIG. 4D).

Figure 5A:
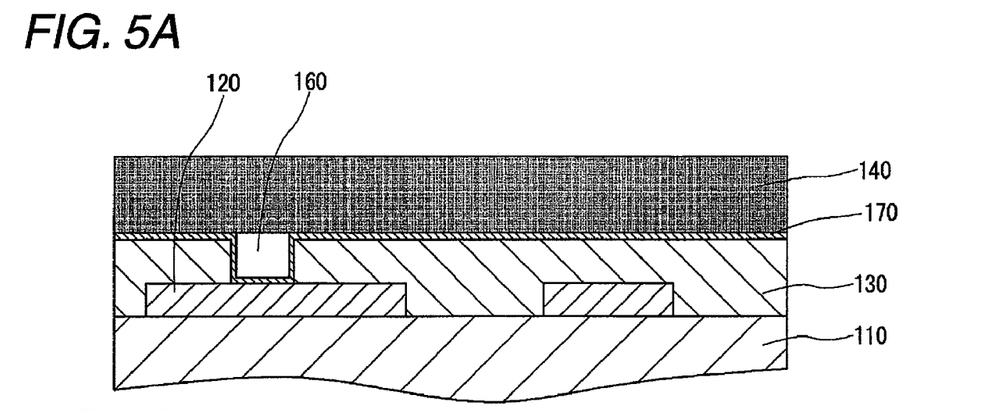
FIGS. 5A to 5C are sectional views showing manufacturing processes of the semiconductor substrate in the related art.
Figure 5B:
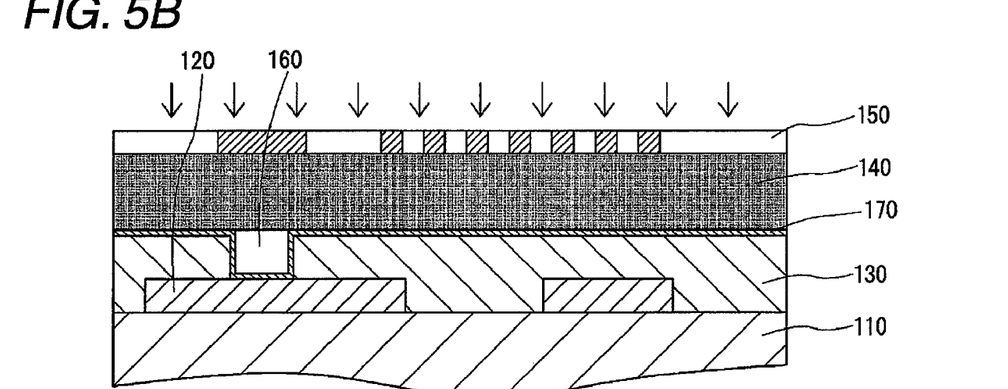
Figure 5C:
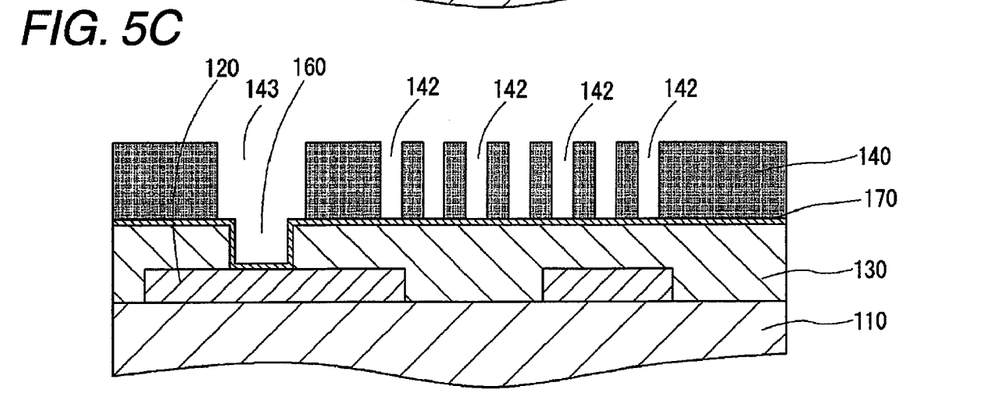

Then, a plating resist 140 is formed on a surface of the plating seed layer 170 (FIG. 5A), then a pattern forming mask 150 is arranged on the plating resist 140 and the plating resist 140 is exposed (FIG. 5B) and developed (FIG. 5C). Thus, grooves 142, 143 are formed through the plating resist 140.

Figure 6A:
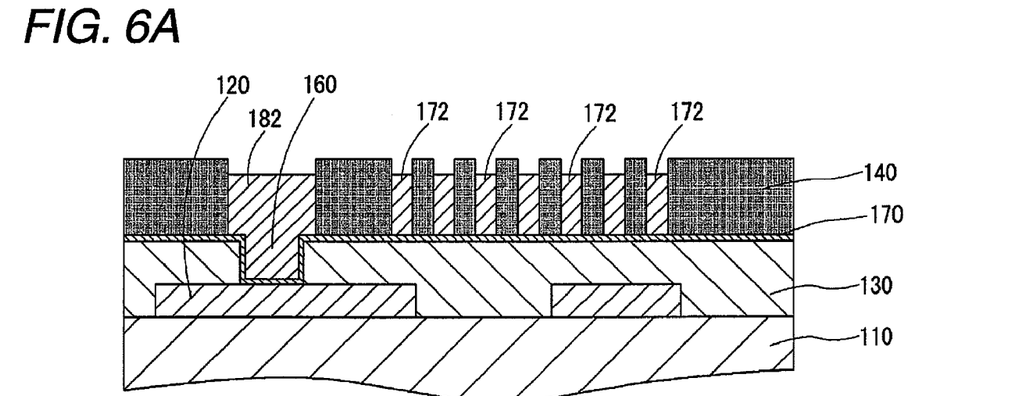
FIGS. 6A to 6C are sectional views showing manufacturing processes of the semiconductor substrate in the related art.
Figure 6B:
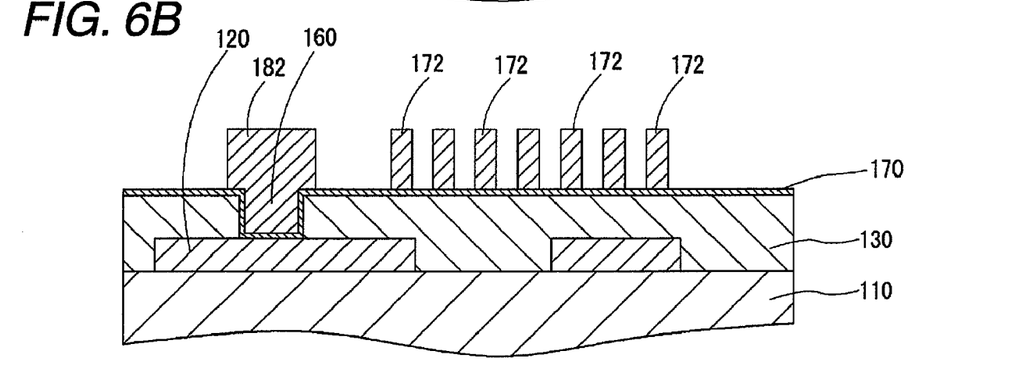
Figure 6C:
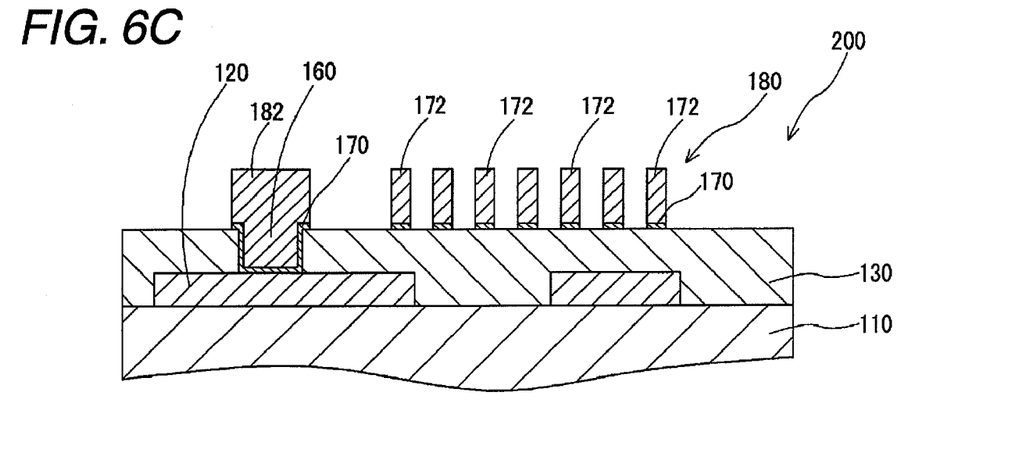

Then, copper plating layers 172 (182) are formed in the grooves 142, 143 by the copper electrolytic plating using the plating seed layer 170 as a power feeding layer (FIG. 6A), and then the plating resist 140 is removed by an etchant (FIG. 6B). Then, portions of the plating seed layer 170 covered with the plating resist 140 are soft-etched using sulfuric acid-hydrogen peroxide etchant, and thus an second wiring pattern 180 and a through via 182 are formed (FIG. 6C).

In the above described method of manufacturing the semiconductor substrate, the first wiring pattern 120 and the second wiring pattern 180 are electrically connected to each other via the through via 182 formed in the via hole 160. Therefore, the via hole 160 and the groove 143 need to be aligned precisely with each other. More concretely, in forming the groove 143, the pattern forming mask 150 need to be arranged on the plating resist 140 to be positioned precisely in the position of the via hole 160.

In arranging the pattern forming mask 150 on the plating resist 140, the pattern forming mask 150 is aligned while using the via hole 160 formed in the insulating layer 130 as an alignment reference position. At this time, on account of an operation precision of the equipment for arranging the pattern forming mask 150 and expansion/contraction of the core substrate 110 in manufacturing step, it is not easy to position the pattern forming mask 150 such that the mask 150 is aligned precisely with all via holes 160 formed in the core substrate 110.

In order to solve such displacement, in the related art, the groove 143 communicated with the via hole 160 is formed to have a larger diameter than the via hole 160 so that displacement between the via hole 160 and the groove 143 is permissible. However, when forming the plating resist 140 through the exposure and development using this pattern forming mask 150, the groove 143 positioned just above the via hole 160 has a diameter larger than the via hole 160, and thus a planar dimension of the through via 182 is increased. Therefore, a pattern forming area of the second wiring pattern 180 is narrowed. As a result, such a problem exists that the design of the second wiring pattern 180 is restricted.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a method of manufacturing a semiconductor substrate, capable of improving the design freedom of wiring patterns formed in an overlying conductor layer by reducing a planer dimension of a through via, and the semiconductor substrate in which wiring patterns are formed in an insulating layer formed on a core substrate, and are electrically connected to each other via the through via respectively.

According to one or more aspects of the present invention, there is provided a method of manufacturing a semiconductor substrate. The method comprises: (a) forming a wiring pattern on a substrate; (b) covering the wiring pattern with an insulating resin, thereby forming a first insulating layer; (c) forming a second insulating layer on the first insulating layer; (d) forming a plurality of grooves through the second insulating layer; (e) forming at least one via hole through the first and second insulating layers by irradiating at least one of the grooves with a laser beam; (f) forming a seed metal layer on an inner surface of the at least one via hole, inner surfaces of the grooves, and a surface of the second insulating layer; and (g) forming a plating layer in the at least one via hole and the grooves, by an electrolytic plating using the seed metal layer as a power feeding layer.

According to one or more aspects of the present invention, there is provided a semiconductor substrate. The semiconductor substrate comprises: a substrate; a first wiring pattern formed on the substrate; a first insulating layer covering the first wiring pattern; a second insulating layer formed on the first insulating layer and comprising a plurality of grooves formed therethrough; a plurality of second wiring patterns filled in the plurality of grooves; a through via formed through the first and second insulating layers and which electrically connects the first wiring pattern to the second wiring patterns, wherein a side wall of the through via is uniform at a boundary between the first insulating layer and the second insulating layer.

Other aspects and advantages of the present invention will be apparent from the following description, the drawings, and the claims.

DETAILED DESCRIPTION OF EXEMPLARY EMBODIMENTS OF THE INVENTION

Exemplary embodiments of the present invention will be described with reference to the drawings hereinafter.

FIGS. 1A to 3B are sectional views showing the respective manufacturing processes of a semiconductor substrate according to the exemplary embodiment. In the semiconductor substrate shown in FIGS. 1A to 3B, only the one side portion of a core substrate is shown. However, as a matter of course, the lower surface of the core substrate can be formed similarly to the upper surface.

Figure 1A:
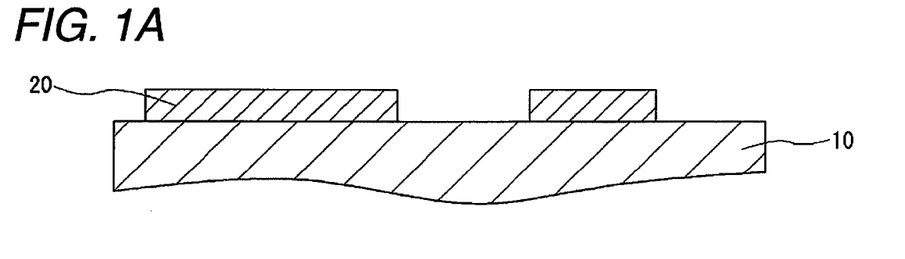
FIGS. 1A to 1D are sectional views showing manufacturing processes of a semiconductor substrate according to an exemplary embodiment of the present invention.

First, as shown in FIG. 1A, a first wiring pattern 20 is formed on a surface of a core substrate 10 that is formed of a double-sided copper-clad substrate. The first wiring pattern 20 is formed by covering a metal layer, which is formed of a copper foil and covers a surface of the core substrate 10, with an etching resist and then etching the metal layer by means of the subtractive process.

Figure 1B:
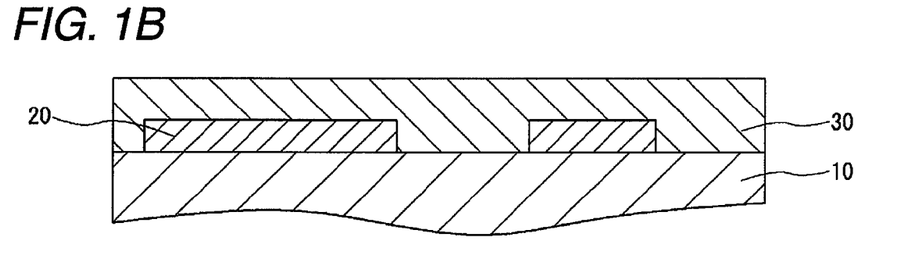

Then, as shown in FIG. 1B, a first insulating layer 30 (referred simply to as an "insulating layer 30" hereinafter) is formed by covering the core substrate 10 with an insulating resin, which serves to insulate the first wiring pattern 20 and a second wiring layer. The insulating layer 30 may be formed by coating a liquid epoxy resin or laminating a film-like epoxy resin.

Figure 1C:
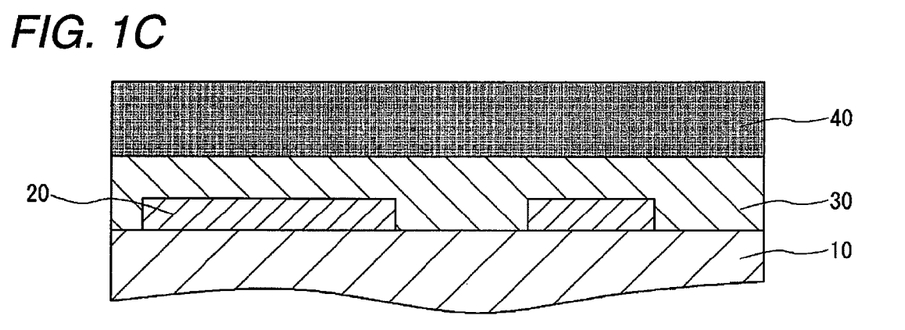

Then, as shown in FIG. 1C, a plating resist 40 serving as a second insulating layer is formed on an upper surface of the insulating layer 30. In the present embodiment, the plating resist 40 is not removed after the plating is deposited, and serves as an insulating layer that insulates the respective second wiring patterns 80. In the present embodiment, a film resist made of a photosensitive resin may be used as the plating resist 40.

Figure 1D:
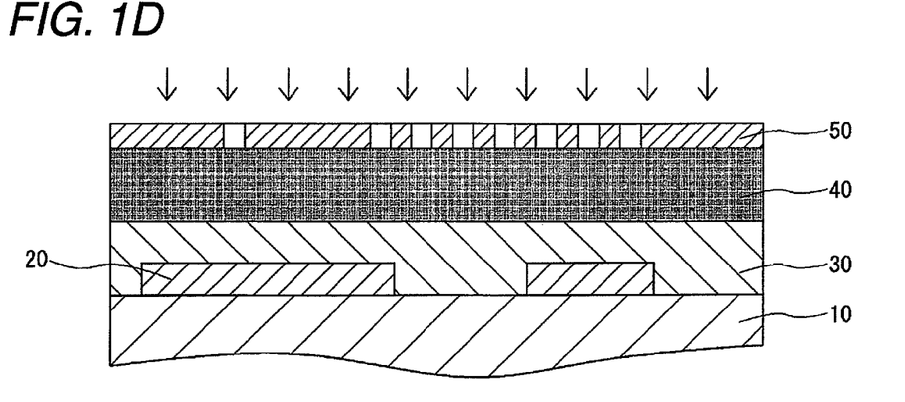

As shown in FIG. 1D, a mask 50 is positioned on a surface of the plating resist 40. Then, the plating resist 40 is exposed by the exposure device, and then uncured portions of the plating resist 40 are removed (developed). As a method of aligning the mask 50 with the plating resist 40, the mask 50 may be positioned on the plating resist 40 on a basis of a shape of the first wiring pattern 20, which is viewed by a shooting means for seeing through the plating resist 40 and the insulating layer 30.

Figure 2A:
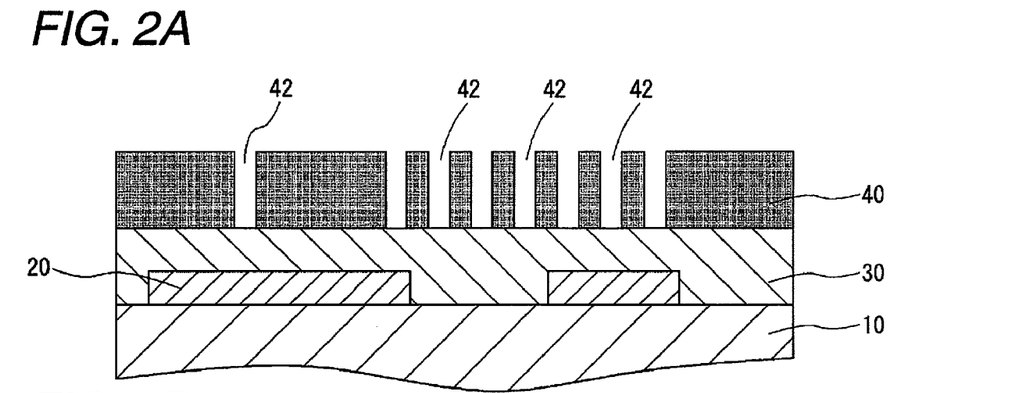
FIGS. 2A to 2C are sectional views showing manufacturing processes of the semiconductor substrate according to the exemplary embodiment of the present invention.

FIG. 2A shows a state in which the plating resist 40 having grooves 42 therethrough, which is used to form the second wiring pattern 80 therein, is formed on a surface of the insulating layer 30.

Figure 2B:
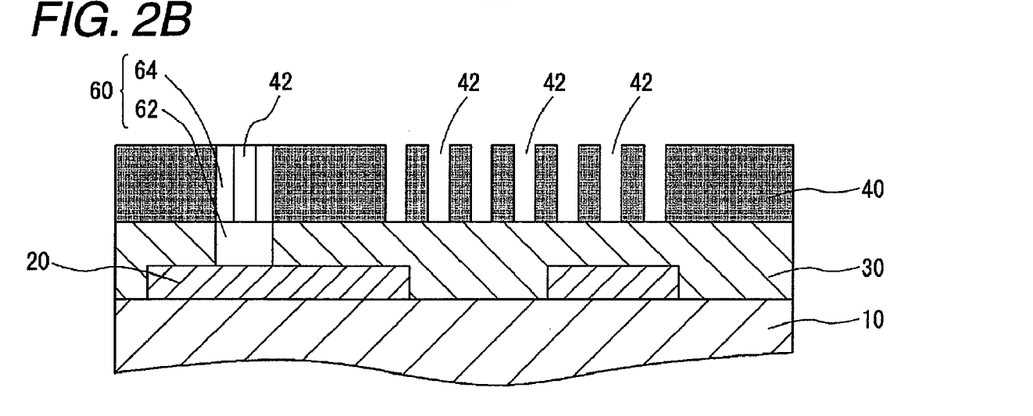

Then, a via hole 60 is formed in a given position by a laser beam (FIG. 2B). The via hole 60 is formed in the portion in which a through via that connects the first wiring pattern 20 and the second wiring pattern 80 is to be formed.

The plating resist 40 has already exposed and cured by the photolithography method. Therefore, the hole can be simply formed by irradiating the laser beam. As the position in which the via hole 60 is formed, the grooves 42 formed through the plating resist 40 may be viewed by the shooting means and then the forming position of the via hole 60 may be calculated based on the patterning position of the grooves 42.

The first wiring pattern 20 serves as a stopper for the laser beam irradiated from the laser beam illuminating machine. Therefore, the via hole 60 is formed which communicates with in the thickness direction of the plating resist 40 and the insulating layer 30 and from which the first wiring pattern 20 is exposed. Also, as shown in FIG. 2B, the via hole 60 is formed in both the plating resist 40 and the insulating layer 30 by one laser beam irradiating step. Thus, the via hole 60 is formed to have a successive shape.

That is, a diameter of a via hole portion 62 in the insulating layer 30 is the same as that of a via hole portion 64 in the plating resist 40 at the boundary surface between the plating resist 40 and the insulating layer 30. In other words, a stepped portion and a displaced portion are not formed on inner peripheral surfaces of the via hole portions 62, 64 at the boundary surface between the plating resist 40 and the insulating layer 30. Accordingly, a planar dimension of the through via 82 in the via hole 60 of the second wiring pattern 80 can reduced as small as possible.

Figure 2C:
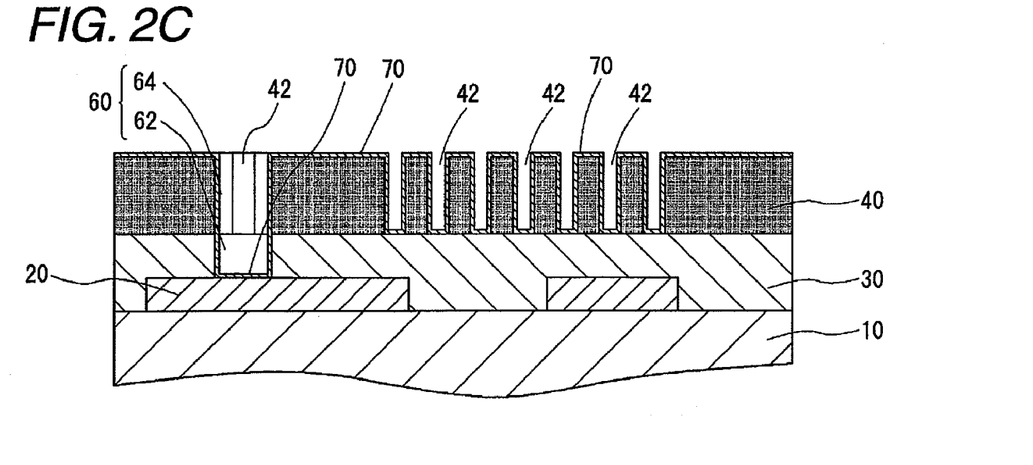

After the via hole 60 is formed, contaminations such as melted residues of the plating resist 40 and the insulating layer 30 left in the via hole 60 are removed by the alkaline cleaning (the dismear process). Then, a plating seed layer 70 is formed on the surface of the plating resist 40 and the inner wall surface of the via hole 60 (i.e., portions of the plating resist 40 and the insulating layer 30 exposed from the via hole 60 and portion where the first wiring pattern 20 is exposed from the via hole 60) by the copper electroless plating (FIG. 2C). Instead of the plating seed layer 70, a seed metal layer formed by sputtering a copper may be employed.

Figure 3A:
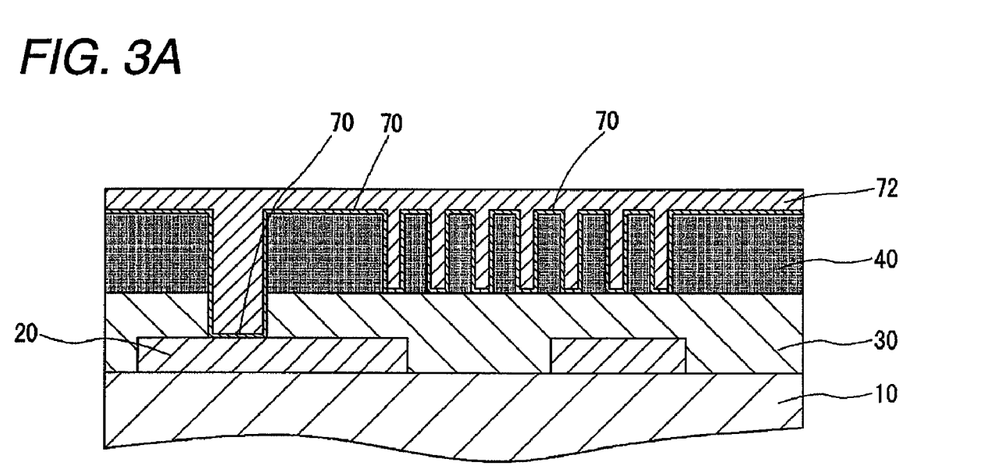
FIGS. 3A and 3B are sectional views showing manufacturing processes of the semiconductor substrate according to the exemplary embodiment of the present invention.

After the plating seed layer 70 is formed, a copper plating layer 72 is formed by the copper electrolytic plating. In the present embodiment, as shown in FIG. 3A, the copper electrolytic plating is applied until the copper plating layer 72 covers completely the upper surface of the plating resist 40. After the copper plating layer 72 is formed in this manner, the copper plating layers 72 deposited on the upper surface of the plating resist 40 are polished using the polishing device. Therefore, the individual copper plating layers 72 filled in the grooves 42 formed through the plating resist 40 are formed, and thus the second wiring pattern 80 is formed (FIG. 3B).

In the present embodiment, in polishing the copper plating layers 72, the polishing process of the copper plating layers 72 are continued until at least the plating seed layer 70 formed on the upper surface of the plating resist 40 is removed. As the case may be, the polishing process may be continued until the plating resist 40 and the copper plating layers 72 have a given height dimension. As the polishing machine, the Chemical Mechanical Polishing (CMP) machine may be employed.

Figure 3B:
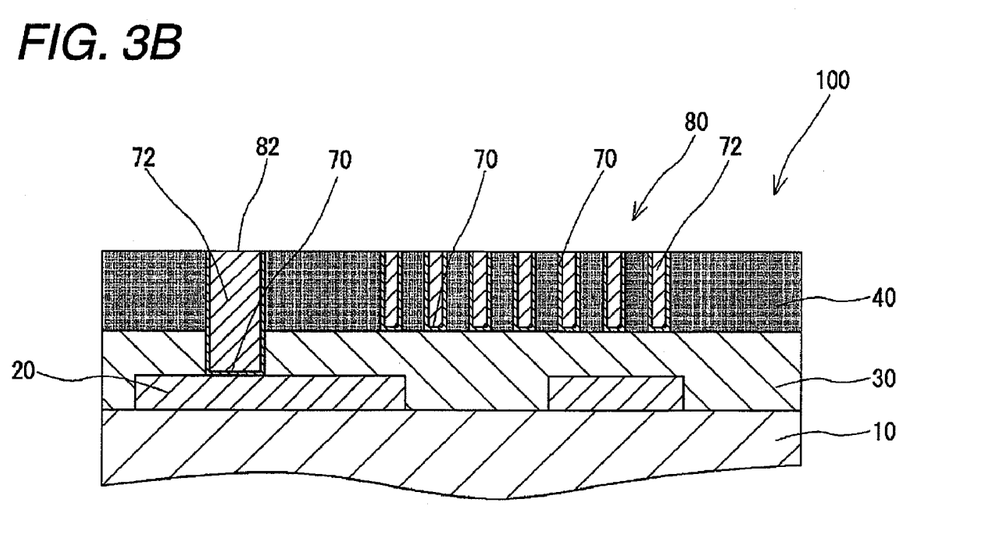
Figure 4A:
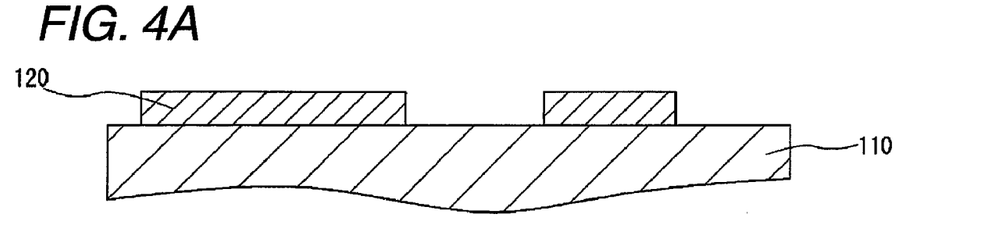
FIGS. 4A to 4D are sectional views showing manufacturing processes of a semiconductor substrate in the related art.
Figure 4B:
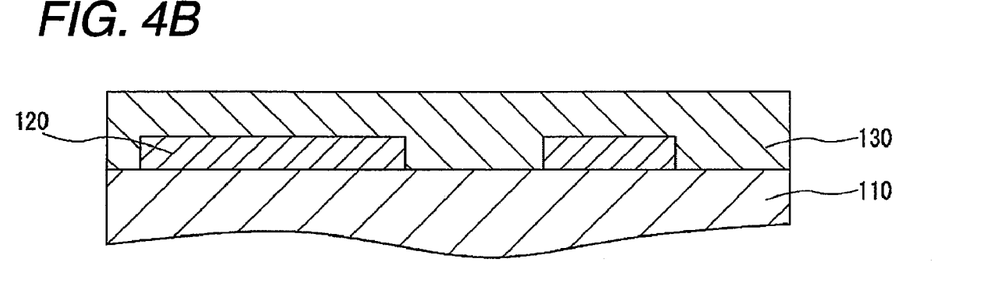
Figure 4C:
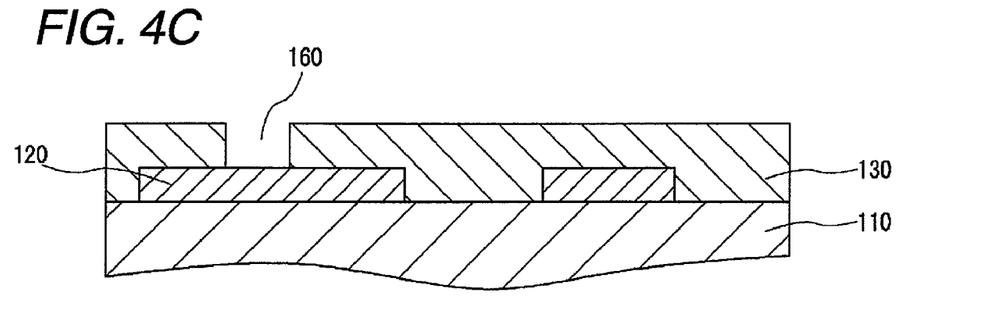
Figure 4D:
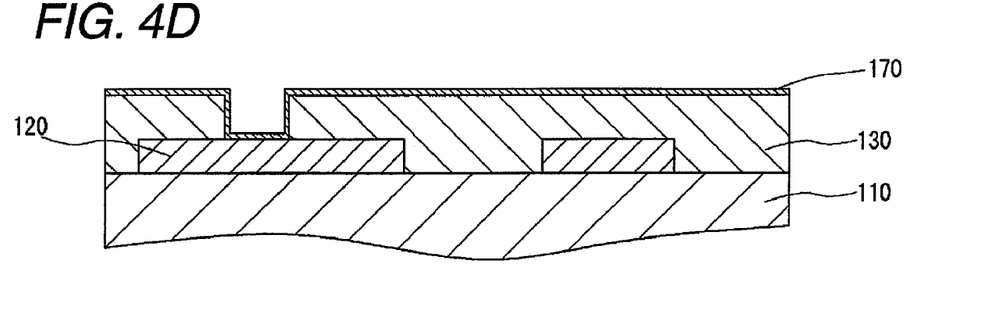

According to a semiconductor substrate 100 obtained by the above described manufacturing method, as shown in FIG. 3B, the first wiring pattern 20 is formed on the surface of the core substrate 10, and the first wiring pattern 20 is covered with the insulating layer 30. The plating resist 40 having the grooves 42 therein is formed on the insulating layer 30, the copper plating layer 72 is filled in the via hole 60 that extends from the surface of the plating resist 40 to the surface of the first wiring pattern 20 respectively, and thus the vias are formed to electrically connect the first wiring pattern 20 and the second wiring pattern 80.

The via hole 60 is formed continuously such that the inner peripheral surface is formed as a coplanar surface (no stepped portion is formed on the inner peripheral surface) from the surface of the plating resist 40 to the first wiring pattern 20. The copper plating layers 72 are deposited to cover the surface of the plating resist 40, and then the individual copper plating layers 72 are formed in the second wiring pattern 80 through the polishing process.

That is, in the semiconductor substrate 100 in the present embodiment, the second wiring pattern 80 is formed by a damascene method, while using the double-layered insulator consisting of the insulating layer 30 and the plating resist (second insulating layer) 40. Accordingly, as shown in FIG. 3B, a planar dimension of the through via 82 formed just above the via hole 60 can be reduced (the same dimension as the diameter dimension on the upper end surface of the via hole 60). Therefore, the design freedom of the second wiring pattern 80 can be improved considerably.

Also, since the plating resist 40 is formed of a photosensitive resin, the insulating layer 30 formed of a non-photosensitive resin can act as a stopper layer by employing the photolithography method in forming the grooves 42 constituting the second wiring pattern 80. Since a height dimension of the grooves 42 is defined by a film thickness of the plating resist 40, a depth dimension of the grooves 42 can be controlled uniformly. In addition, the second wiring pattern 80 is formed by applying the polishing process to the surface of the plating resist 40 and the copper plating layers 72. Therefore, the wiring dimension of the second wiring pattern 80 can be set with good precision. Particularly, the impedance characteristic of the second wiring pattern 80 can be improved.

While the present invention is described in detail with reference to the exemplary embodiment, it is not limited to the exemplary embodiment explained above. For example, the copper is employed as the material of the wiring patterns in the present embodiment, but it is of course that other conductors may be employed.

Also, although not shown, according to the semiconductor substrate 100 in the present embodiment, further wiring patterns may be formed on the second wiring pattern 80, and thus three-layered wiring patterns or more may be formed on one surface of the semiconductor substrate 100. As the method of forming the wiring patterns of the third layers or later, the method shown in FIG. 1B to 3B may be applied as it is.

Concretely, three-layered wiring pattern or more may be formed on one side surface of the core substrate 10, and then the wiring pattern formed on the uppermost layer and either the wiring pattern formed just below the uppermost layer or any one single or plural wiring pattern formed at an interval may be electrically connected via the through via filled in the via hole 60. Also, when three-layered wiring pattern or more are provided on one side surface of the core substrate 10, adjacent wiring patterns out of the wiring patterns formed in the intermediate position or any one single or plural wiring pattern formed at an interval may be of course electrically connected via the through via filled in the via hole 60.

According to the exemplary embodiment of the present invention, a planar shape of the through via can be made smaller, a loss of the planar area for forming the second wiring patterns can be reduced, and the design freedom of the second wiring patterns can be improved considerably. Also, since the via hole is formed in one step, an error caused upon forming the via hole can be reduced.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A method of manufacturing a semiconductor substrate, the method comprising:
   (a) forming a first wiring pattern on a substrate;
   (b) covering the first wiring pattern with an insulating resin, thereby forming a first insulating layer;
   (c) forming a second insulating layer on the first insulating layer;
   (d) forming a plurality of grooves through only a top surface of the second insulating layer to expose a top surface of the first insulating layer;
   (e) forming at least one via hole through the first and second insulating layers by irradiating at least a portion of the plurality of grooves with a laser beam while another portion of the plurality of grooves extend only through the top surface of the second insulating layer to the top surface of the first insulating layer;
   (f) forming a seed metal layer on an inner surface of the at least one via hole, inner surfaces of the grooves, and a surface of the second insulating layer; and
   (g) forming a plating layer in the at least one via hole to form a through via and the grooves to form a second wiring layer, by an electrolytic plating using the seed metal layer as a power feeding layer, wherein the second wiring layer contacts the surface of the first insulating layer; and
   (h) polishing the plating layer until the seed metal layer on the surface of the second insulating layer is removed,
   wherein after step (h), surfaces of the through via and the second wiring layer are flush with the surface of the second insulating layer, and
   wherein a diameter of a portion of the at least one via hole in the second insulating layer is the same as a diameter of a portion of the at least one via hole in the first insulating layer.

2. The method according to claim 1, wherein step (g) comprises: forming the plating layer such that the plating layer covers the surface of the second insulating layer.

3. The method according to claim 1, wherein the second insulating layer is made of a photosensitive resin material, and
   wherein step (d) comprises forming the grooves by exposing and developing the second insulating layer.

4. The method according to claim 1, wherein step (d) comprises:
   forming a plurality of grooves through the second insulating layer, viewing the plurality of grooves, and calculating a via forming position based on a pattern of the grooves.

5. A semiconductor substrate, comprising:
   a substrate;
   a first wiring pattern formed on the substrate;
   a first insulating layer covering the first wiring pattern;
   a second insulating layer formed on the first insulating layer and comprising a plurality of grooves formed through only a top surface of the second insulating layer to a top surface of the first insulating layer;
   a plurality of second wiring patterns filled in the plurality of grooves, wherein the plurality of second wiring patterns contacts the surface of the first insulating layer;
   a through via formed through the first and second insulating layers and which electrically connects the first wiring pattern to the second wiring patterns, wherein a side wall of the through via is uniform at a boundary between the first insulating layer and the second insulating layer, wherein surfaces of the through via and the second wiring patterns are flush with a surface of the second insulating layer, wherein a first portion of the plurality of grooves are formed through only the top surface of the second insulating layer to the top surface of the first insulating layer and a second portion of the plurality of grooves are irradiated to form the through via, and wherein a diameter of a portion of the through via in the second insulating layer is the same as a diameter of a portion of the through via in the first insulating layer.

6. The semiconductor substrate according to claim 5, wherein the second insulating layer is made of a photosensitive resin.

* * * * *